United States Patent [19]
Nebe et al.

[11] Patent Number: 4,912,019
[45] Date of Patent: Mar. 27, 1990

[54] PHOTOSENSITIVE AQUEOUS DEVELOPABLE CERAMIC COATING COMPOSITION

[75] Inventors: William J. Nebe, Wilmington, Del.; James J. Osborne, Kennett Square, Pa.

[73] Assignee: E. I. Du Pont de Nemours and Company, Wilmington, Del.

[21] Appl. No.: 200,401

[22] Filed: May 31, 1988

[51] Int. Cl.$^4$ .............................................. G03C 1/68
[52] U.S. Cl. .................................... 430/281; 430/198; 430/269; 430/270; 430/286; 430/287; 430/330; 430/905; 430/910; 522/71; 522/83
[58] Field of Search ............... 430/198, 269, 270, 281, 430/286, 287, 330, 905, 910; 427/96; 522/71, 83; 501/153

[56] References Cited

U.S. PATENT DOCUMENTS

| | | | |
|---|---|---|---|
| 4,229,517 | 10/1980 | Bratt et al. | 430/271 |
| 4,273,857 | 6/1981 | Leberzammer et al. | 430/281 |
| 4,496,509 | 1/1985 | Kita et al. | 264/175 |
| 4,536,535 | 8/1985 | Usala | 524/403 |
| 4,613,560 | 9/1986 | Dueber et al. | 430/286 |
| 4,724,021 | 2/1988 | Martin et al. | 156/89 |

Primary Examiner—Jack P. Brammer

[57] ABSTRACT

A photosensitive ceramic coating composition which is fireable in a substantially nonoxidizing atmosphere comprising an admixture of:

(a) finely divided particles of ceramic solids having a surface area-to-weight ratio of no more than 10 m$^2$/g and at least 80 wt. % of the particles having a size of 1–10 μm, and (b) finely divided particles of an inorganic biner having a glass transition temperature in the range from of 550° to 825° C., a surface area-to-weight ratio of no more than 10 m$^2$/g and at least 90 wt. % of the particles having a size of 1–10 μm, the weight ratio of (b) to (a) being in a range from 0.6 to 2, dispersed in an organic medium comprising (c) an organic polymeric binder, and
(d) a photoinitiation system, dissolved in
(e) photohardenable monomer, and
(f) an organic medium wherein the improvement comprises an organic polymeric binder containing a copolymer or interpolymer of a $C_1$–$C_{10}$ alkyl acrylate, $C_1$–$C_{10}$ methacrylate, styrene, substituted styrene or combinations thereof and an ethylenically unsaturated carboxylic acid, wherein a moiety in the binder derived from the unsaturated carboxylic acid comprises at least 15 weight percent of the polymer and wherein the binder has a molecular weight not greater than 50,000 and wherein the composition upon imagewise exposure to actinic radiation is developable in an aqueous solution containing 1 percent by weight sodium carbonate.

7 Claims, No Drawings

PHOTOSENSITIVE AQUEOUS DEVELOPABLE CERAMIC COATING COMPOSITION

BACKGROUND OF THE INVENTION

The present invention is directed to an improved photosensitive ceramic coating composition and more particularly a coating composition which functions as a precursor to a fired ceramic which has the ability to serve as a dielectric material particularly useful in formation of multilayer thick film circuits.

The present invention is directed to an improved photosensitive ceramic coating composition which can be fired in a substantially nonoxidizing atmosphere disclosed in Dueber et al. U.S. Pat. No. 4,613,560 issued Sept. 23, 1986. This patent discloses a coating composition which comprises an admixture of:

(a) finely divided particles of ceramic solids having a surface area-to-weight ratio of no more than 10 m$^2$/g and at least 75 wt. % of the particles having a size of 1-10 μm.

(b) finely divided particles of an inorganic binder having a surface area-to-weight ratio of no more than 10 m$^2$/g and at least 95 wt. %, of the particles having a size of 1-10 μm, the weight ratio of (b) to (a) being 0.6-2, dispersed in an organic medium comprising (c) an organic polymeric binder selected from the group consisting of (1) homopolymer and copolymers of C$_{1-10}$ alkyl acrylates, C$_{1-10}$ alkyl methacrylates, alpha-methylstyrene and 0-2 wt. % ethylenically unsaturated carboxylic acid, amine or silane-containing compounds, (2) homopolymers and copolymers of C$_{1-10}$ alkyl mono-olefins, (3) homopolymers and copolymers of C$_{1-4}$ alkylene oxide and mixtures thereof, the binder comprising 5-25 wt. % basis total inorganic solids, and (d) a photoinitiation system, dissolved in (e) photohardenable monomer and (f) volatile nonaqueous organic solvent.

As set forth in this patent processing involves the coating composition being (1) laminated to a ceramic substrate, (2) exposed imagewise to actinic radiation to effect hardening of the exposed areas of the film, (3) solvent developed to remove unexposed areas of the film, and (4) fired in a substantially nonoxidizing atmosphere to effect volatilization of the organic medium and sintering of the inorganic binder and ceramic solids.

As further background to the present invention multilayer thick film circuits have been used for many years to increase circuit functionality per unit of area. Moreover, recent advances in circuit technology have placed new demands on dielectric materials for this use. Heretofore, most of the dielectric materials used in multiple circuits have been conventional thick film dielectric compositions. These are comprised of finely divided particles of dielectric solids and inorganic binders dispersed in an inert organic medium. Such thick film materials are usually applied by screen printing, though they may be applied by other means as well.

Thick film materials of this type are very important and will continue to be so. However, when applying these thick film materials by screen printing, it is difficult to obtain fine line and space resolution. It is essential that all the screen printing variables such as screen quality, squeegee hardness, print speed, dispersion properties, etc., be most carefully controlled and constantly monitored to obtain good product yields. Similar problems exist, of course, with the use of thick film conductor and resistor materials.

One approach to this problem is (1) to apply a layer of the dielectric material to a substrate by means of dispersion in a photosensitive medium, (2) to expose the layer imagewise to actinic radiation, (3) to solvent develop the pattern to remove unexposed portions of the layer, and (4) to fire the remaining exposed portions of the pattern to remove all remaining organic materials and to sinter the inorganic materials.

A disadvantage of prior art compositions and particularly compositions disclosed in U.S. Pat. No. 4,613,560 is an organic solvent is necessary to develop such material after imagewise exposure to actinic radiation, i.e., an organic solvent removes areas of the composition which have not been exposed to actinic radiation without removal of areas which have been exposed.

SUMMARY OF THE INVENTION

The present invention is directed to a photosensitive ceramic coating composition which is fireable in a substantially nonoxidizing atmosphere comprising an admixture of:

(a) finely divided particles of ceramic solids having a surface area-to-weight ratio of no more than 10 m$^2$/g and at least 80 wt. % of the particles having a size of 1-10 μm, and (b) finely divided particles of an inorganic binder having a glass transition temperature in the range from of 550° to 825° C., a surface area-to-weight ratio of no more than 10 m$^2$/g and at least 90 wt. % of the particles having a size of 1-10 μm, the weight ratio of (b) to (a) being in a range from 0.6 to 2, dispersed in an organic medium comprising (c) an organic polymeric binder, and (d) a photoinitiation system, dissolved in (e) photohardenable monomer, and (f) an organic medium wherein the improvement comprises an organic polymeric binder containing a copolymer or interpolymer of a C$_1$-C$_{10}$ alkyl acrylate or C$_1$-C$_{10}$ alkyl methacrylate, styrene, substituted styrene or combinations thereof and an ethylenically unsaturated carboxylic acid, wherein a moiety in the binder derived from the unsaturated carboxylic acid comprises at least 15 weight percent of the polymer and wherein the binder has a molecular weight not greater than 50,000 and wherein the composition upon imagewise exposure to actinic radiation is developable in an aqueous solution containing 1 percent by weight sodium carbonate.

DETAILED DESCRIPTION OF THE INVENTION

The present invention is directed to an improved photosensitive ceramic coating disclosed in Dueber et al. U.S. Pat. No. 4,613,560. Since components of this patent can be employed in the present invention as modified herein, this patent is incorporated by reference with portions of directly reproduced herein. Also the same processing steps can be employed with compositions of the present invention as in U.S. Pat. No. 4,613,560 except a different developer is employed to remove areas of the composition which have not been exposed to actinic radiation without removal of areas which have been exposed to such radiation.

CERAMIC SOLIDS

The invention is applicable to virtually any high melting inorganic solid material. However, it is particularly suitable for making dispersions of dielectric solids such as alumina, titanates, zirconates and stannates. It is also applicable to precursors of such materials, i.e., solid materials which upon firing are converted to dielectric solids, and to mixtures of any of these.

Among the many dielectric solids which are likely to be used in the invention are $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$. As will be apparent to those skilled in the ceramic arts, the exact chemical composition of the ceramic solids to be used in the composition of the invention is not ordinarily critical in the rheological sense. It is also preferred that the ceramic solids not have swelling characteristics in the organic dispersion since the rheological properties of the dispersion may be substantially changed thereby.

It has been found that the dispersion of the invention must contain no significant amount of solids having a particle size of less than 0.2 μm in order to obtain adequately complete burnout of the organic medium when the films or layers thereof are fired to remove the organic medium and to effect sintering of the inorganic binder and the ceramic solids. However, none of the ceramic solids ordinarily will exceed 20 μm and, furthermore, at least 80 wt. % of the ceramic solids must have a size of 1–10 μm. When the dispersions are used to make thick film pastes, which are usually applied by screen printing, the maximum particle size must not exceed the thickness of the screen, and when the dispersion is used to make dry photosensitive film, the maximum particle size must not exceed the thickness of the film. It is preferred that at least 80 wt. % of the ceramic solids fall within the 1–10 μm range.

In addition, it is preferred that surface area/weight ratio of the ceramic particles not exceed 10 $m^2/g$ for the reason that such particles tend to affect adversely the sintering characteristics of the accompanying inorganic binder. It is still further preferred that the surface area/weight ratio not exceed 5 $m^2/g$. Ceramic particles having a surface area/weight ratio of 1–5 have been found to be quite satisfactory.

A preferred particle size for d50, i.e., a point at which the weight of smaller particles equal the weight of larger particles, is in a range from 2.30–2.70 microns. This size range is preferred to achieve a blister free surface while maintaining a hermetic structure. This particle size range is similar to a preferred range for inorganic binder of glass frit, namely a range from 2.30–2.70 microns (d50).

A preferred material is alumina with a preferred procedure is to pass the milled water alumina slurry through a fine mesh screen (ex. 400 mesh) to remove large particles and also through a magnetic separator. The magnetic separator removes all magnetic conductive materials which otherwise would increase the conductivity of the final product.

Of critical importance is to achieve a ceramic solid composition which is agglomerate free. Normally after milling a ceramic, to achieve desired particle size distribution, the water or mixing solvent is removed by either vacuum assisted heating or heating in an air stream. This technique results in some of the ceramic particulates becoming agglomerated, resulting, after firing, in a part with large particulates clusters and/or blisters.

This particularly serious disadvantage is eliminated in a preferred procedure by freeze drying the milled alumina. The very mild conditions of freeze drying eliminates the potential for agglomeration which normally results when powders are heated. A similar technique is applicable for different ceramic solids.

INORGANIC BINDER

The glass frit used in the present invention aids in sintering the inorganic crystalline particulates and may be of any well known composition which has a melting temperature below that of the ceramic solids. Nevertheless, in order to get adequate hermeticity of the devices, it is preferred that the glass transition temperature ($T_g$) of the inorganic binder be 550°–825° C. and still more preferably 575°–750° C. If melting takes place below 550° C., organic material will likely be encapsulated and blisters will tend to form in the dielectric layer as the organics decompose. On the other hand, a glass transition temperature above 825° C. will tend to produce a porous dielectric when sintering temperatures compatible with copper metallizations, e.g., 900° C., are used.

The glass frits most preferably used are the borosilicate frits, such as lead borosilicate frit, bismuth, cadmium, barium, calcium or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a vibratory (Sweco Co.) mill with water to reduce the particle size of the frit and to obtain a frit of substantially uniform size.

Thereafter the frit is preferably processed in a similar manner as the ceramic solids. The frit is passed through a fine mesh screen to remove large particles since the solid composition should be agglomerate free. The inorganic binder like the ceramic solids should have a surface to weight ratio of no more than 10 $m^2/g$ and at least 90 wt. % of the particles preferably have a particle size of 1–10 μm.

It is preferred that the d50 of the inorganic binder, which is defined as equal parts by weight of both larger and smaller particles, be equal to or less than that of the ceramic solids. For given particle size ceramic solids, the inorganic binder/ceramic solids ratio required to achieve hermeticity will decrease as the inorganic binder size decreases. With a given ceramic solids-inorganic binder system, if the ratio of inorganic binder to ceramic solids is significantly higher than that required to achieve hermeticity, the dielectric layer tends to form blisters on firing. If the ratio is significantly lower, the fired dielectric will be porous and therefore nonhermetic.

Within the above-described particle size and surface area limits, it is nevertheless preferred that the inorganic binder particles be 0.5–6 μm. The reason for this is that smaller particles having a high surface area tend to absorb the organic materials and thus impede clean decomposition. On the other hand, larger size particles tend to have poorer sintering characteristics. It is preferred that the ratio of inorganic binder to ceramic solids be 0.6–2.

PHOTOINITIATION SYSTEM

Suitable photoinitiation systems are those which are thermally inactive but which generate free radicals upon exposure to actinic light at or below 185° C. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

PHOTOHARDENABLE MONOMER

The photohardenable monomer component of the invention is comprised of at least one addition polymerizable ethylenically unsaturated compound having at least one polymerizable ethylenic group. Such compounds are capable of forming a high polymer by free radical initiated, chain propagating addition polymerization. The monomeric compounds are nongaseous, i.e., they have a normal boiling point above 100° C. and a plasticizing action on the organic polymeric binder.

Suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxy-phenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred monomers are polyoxyethylated trimethylolpropane triacrylate, ethylated pentaerythritol triacrylate, dipentaerythritol monohydroxypentaacrylate and 1,10-decanediol dimethylacrylate. The unsaturated monomeric component is present in an amount of 5 to 45% by weight based on the total weight of the dry photopolymerizable layer. Other preferred monomers are monohydroxypolycaprolactone monoacrylate, polyethyleneglycol diacrylate (mol. wt. approximately 200), and polyethylene glycol 400 dimethacrylate (mol. wt. approximately 400).

ORGANIC MEDIUM

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion.

When the dispersion is to be made into a film, the organic medium in which the ceramic solids and inorganic binder are dispersed consists of the polymeric binder, monomer and initiator which are dissolved in a volatile organic solvent and, optionally, other dissolved materials such as plasticizers, release agents, dispersing agents, stripping agents, antifouling agents and wetting agents.

The solvent component of the organic medium, which may be a mixture of solvents, is chosen so as to obtain complete solution therein of the polymer and to be of sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethyl pentanediol-1,3-mono-isobutyrate, toluene, methylene chloride, and ethylene glycol monoalkyl and dialkyl ethers such as ethylene glycol mono-n-propyl ether. For casting films, methylene chloride is particularly preferred because of its volatility.

Frequently the organic medium will also contain one or more plasticizers which serve to lower the $T_g$ of the binder polymer. Such plasticizers help to assure good lamination to ceramic substrates and enhance the developability of unexposed areas of the composition. However, the use of such materials should be minimized in order to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate triethyleneglycol diacetate and polyester plasticizers. Dibutyl phthalate is frequently used on acrylic polymer systems because it can be used effectively in relatively small concentrations.

The photosensitive compositions of the invention will frequently be employed as the photosensitive layer of a resist element in which the photosensitive layer is coated upon a support film.

In conventional photoresist elements, it is necessary, or at least highly desirable, to protect the photosensitive layer by a removable cover sheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototool.

The photopolymerizable composition is coated upon the support film at a dry coating thickness of about 0.001 inch (~0.0025 cm) to about 0.01 inch (~0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (~0.0013 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.001 inch (~0.0025 cm).

When an element contains no removable, protective cover sheet and is to be stored in roll form, the reverse side of the strippable support preferably has applied thereto a thin release layer of a material such as wax or silicone to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer during storage prior to use.

It is preferred that the weight ratio of the inorganic solids (dielectric and glass) to organics be within the range of 2.0 to 6.0 and, more preferably, from 2.6 to 4.5. A ratio of no more than 6.0 is necessary to obtain adequate dispersion and rheological properties. However, below 2.5, the amount of organics which must be burned off is excessive and the quality of the final layers suffers. The ratio of inorganic solids to organics is dependent on the particle size of the inorganic solids, the organic components and on surface pretreatment of the inorganic solids. When the particles are treated with organosilane coupling agents, the ratio of inorganic solids to organics can be increased. It is preferred to use a lower level of organics to minimize firing defects. It is especially important that the ratio of inorganics to organics be as high as possible. Organosilanes suitable for use in the invention are those corresponding to the general formula $RSi(OR')_3$ in which $R'$ is methyl or ethyl and R is selected from alkyl, methacryloxypropyl, polyalkylene oxide or other organic functional groups which interact with the organic matrix of the film.

On the other hand, when the dispersion is to be applied as a thick film paste, conventional thick film organic media can be used with appropriate rheological adjustments and the use of lower volatility solvents.

When the compositions of the invention are formulated as thick film compositions, they will usually be applied to a substrate by means of screen printing. Therefore, they must have appropriate viscosity so that they can be passed through the screen readily. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic media. The organic medium for most thick film compositions is typically a solution of resin in a solvent. The solvent usually boils within the range of 130°–350° C.

Especially suitable resins for this purpose are polymethacrylates of lower alcohols and monobutyl ether of ethylene glycol monoacetate with an acid containing moiety.

The most widely used solvents for thick film applications are terpenes such as alpha- or beta-terpineol or mixtures thereof with other solvents such as kerosene, dibutylphthalate, butyl carbitol, butyl carbitol acetate, hexamethylene glycol and high boiling alcohols and alcohol esters. Various combinations of these and other solvents are formulated to obtain the desired viscosity and volatility requirements for each application.

In accordance with conventional techniques in the art the final composition may be thioxotropic or possess Newtonian chracteristics dependent on the additives introduced into the composition.

The ratio of organic medium to inorganic solids in the dispersions can vary considerably and depends upon the manner in which the dispersion is to be applied and the kind of organic medium used. Normally, to achieve good coverage, the dispersions will contain complementally by weight 50–90% solids and 50–10% organic medium. Such dispersions are usually of semifluid consistency and are referred to commonly as "pastes".

The pastes are conveniently prepared on a three-roll mill. The viscosity of the pastes is typically within the range of 25-200 p.s. The amount and type of organic medium (vehicle) utilized is determined mainly by the final desired formulation viscosity and print thickness.

AQUEOUS BINDER

The binder polymer, which is critical for aqueous processability and results in high resolution contains a copolymer or interpolymer of a $C_1$-$C_{10}$ alkyl acrylate, $C_1$-$C_{10}$ methacrylate, or a substituted or unsubstituted styrene, and an ethylenically unsaturated carboxylic acid containing moiety which is at least 15% by weight of the total polymer weight. A preferred substituted styrene is alpha methyl styrene. Suitable copolymerizable carboxylic acids include ethylenically unsaturated monocarboxylic acids such as acrylic, methacrylic and crotonic acids and ethylenically unsaturated dicarboxylic acids such as fumaric, itaconic, citraconic, vinyl succinic and maleic acids as well as their half esters and, where appropriate, their anhydrides and mixtures thereof. Because they are cleaner burning in low-oxygen atmospheres, methacrylic polymers are preferred over acrylic polymers.

Within the above-described limits for the nonacidic comonomers, it is preferred that the alkylacrylate or methacrylate constitute at least 70 and preferably 75 wt. % of the polymer. Other preferred nonacidic comonomers are styrene and alpha-methyl styrene. These may be present as 50% by weight of the polymers, where the other 50% is a half ester of an acid anhydride such as maleic anhydride.

The nonacidic portion of the polymer binder can contain up to about 50 wt. % of other nonacrylic and nonacidic comonomers as a substitute for the alkyl acrylate or methacrylate portion of the polymer such as derived from acrylonitrile, vinyl acetate, acrylamide, aminoalkylacrylates or methacrylates and the like so long as the previously discussed compositional criteria are met as well as the physical criteria mentioned below. However, it is preferred to use not more than about 25 wt. % of such monomers because they are more difficult to burn out cleanly.

Therefore in addition to the above-described acrylic and methacrylic polymers, various polyolefins such as polyethylene, polypropylene, polybutylene, polyisobutylene, and ethylene-propylene copolymer can also be used. Also useful in the invention are the so-called polyethers which are polymers of lower alkylene oxides, such as polyethylene oxide.

Polymer can be made by those skilled in the art of acrylate polymerization by conventional solution polymerization techniques. Typically, such acidic acrylate polymers are prepared by combining an alpha, beta-ethylenically unsaturated acid with one or more copolymerizable vinyl monomers in a relatively low boiling (75°-150° C.) organic solvent to obtain a 10 to 60% solution of the monomer mixture, then subsequently causing the monomers to polymerize by the addition of a polymerization catalyst and heating the mixture at the reflux temperature of the solution at atmospheric pressure. After the polymerization reaction is essentially complete, the resulting acid polymer solution is cooled to room temperature and samples are removed to determine the viscosity, molecular weight, acid equivalent, etc. of the polymer.

The presence of the acidic monomer component of the composition is critical to this technology. The acid functionality yields developability in aqueous base, such as a 1% solution of sodium carbonate. Concentrations of acid below 15% do not wash out in aqueous base and concentration above 30% generally are unstable under humid conditions and also partially develop in the imaged areas.

Additionally it is necessary to keep the molecular weight of the acid containing binder-polymer to a value not greater than 50,000, preferably not greater than 25,000 and more preferably not greater than 15,000.

The Tg of the binder polymer preferably is above 100° C., as a requirement of the paste is that, after being screen printed the paste is dried at temperatures up to 100° C. A Tg below this value generally results in a very tacky composition. A lower Tg value can be employed for a material applied other than by screen printing.

DISPERSANT

A dispersant is used to insure the efficient wetting of the inorganic by the organic polymers and monomers. A thoroughly dispersed inorganic is desirable to the preparation of a photoactive paste with the needed characteristics of good screen printing and leveling and fire out characteristics. The dispersant acts to allow the polymeric binder to associate or wet the inorganic solids, giving an agglomerate free system. The dispersants of choice are the A-B dispersants generally described in "Use of A-B Block Polymers as Dispersants for Non-aqueous Coating Systems" by H. L. Jakubauskas, Journal of Coating Technology, Vol. 58; Number 736; Pages 71-82. Useful A-B dispersants are disclosed in U.S. Pat. Nos. 3,684,771; 3,788,996; 4,070,388 and 4,032,698 and U.K. Pat. No. 1,339,930 each of which are incorporated herein by reference. A preferred class of A-B dispersants are polymeric materials disclosed in U.S. Pat. No. 4,032,698 supra represented by the structure

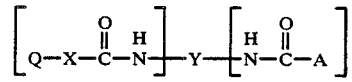

where
Q is a polymeric or copolymeric segment of
  a. an ester of acrylic acid or methacrylic acid with an alkanol of 1-18 carbon atoms;
  b. styrene or acrylonitrile;
  c. a vinyl ester whose ester moiety contains 2-18 carbon atoms; or
  d. a vinyl ether;
X is the residue of a chain transfer agent;
Y is the residue of a di-, tri, or tetraisocyanate radical after removal of isocyanate groups;
A is the residue of a basic radical which, as an entity before reaction, has a $pk_\alpha$ value of 5-14, or a salt thereof; and
m and n are 1, 2 or 3, the total not exceeding 4, provided that when n is 2 or 3, only of A need be as defined.

A particularly preferred member of this class is a polymeric material, hereinafter identified as A-B Dispersant I, represented by the structure

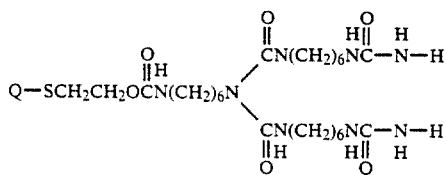

where Q is a methylmethacrylate polymeric segment having a weight average molecular weight between 6000 and 8000. Also particularly preferred is a member of a class of polymeric materials represented by the structure

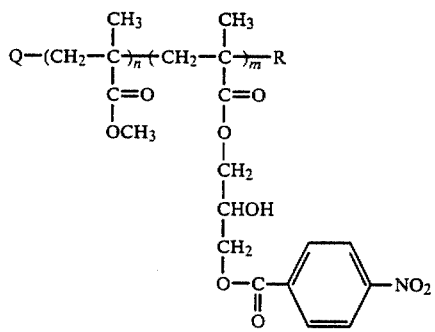

wherein Q is an alkyl methacrylate polymeric segment containing about 20 units of butyl methacrylate, n is 20, m is 8 to 12 and R is a chain terminator residue. This dispersant is hereinafter identified as A-B Dispersant II.

Minor amounts of other components can be present in the photopolymerizable compositions, e.g., pigments, dyes, thermal polymerization inhibitors, adhesion promoters, such as organosilane coupling agents, plasticizers, coating aids such as polyethylene oxides, etc. so long as the photopolymerizable compositions retain their essential properties. Organosilanes are particularly useful in quantities of 3.0 wt. % or less based on the weight of the inorganic particles. Treated particles have a lower demand for organics. Thus, the level of organics in the coating can be reduced, which results in easier burnout upon firing. The organosilane can also improve the dispersion properties and allow a lower inorganic binder/ceramic solids ratio at equivalent hermeticity.

PROCESSING

The photosensitive ceramic coating compositions are conventionally applied to a substrate in formation of a layer such as in the form of a film applied to the substrate or in the form of a paste applied such as by silk screening. Thereafter the ceramic composition is imagewise exposed to actinic radiation to obtain areas which have been exposed to actinic radiation and areas which have not been exposed. Unexposed areas of the layer are removed in a process known as development. For aqueous development the layer will be removed in portions which are not exposed to radiation but exposed portions will be substantially unaffected during development by a liquid such as wholly aqueous solutions containing 1% sodium carbonate by weight within the typical development duration. Generally development takes place within 0.25 to 2 minutes.

Other processing steps which may be conventional can take place before a firing operation takes place, particularly in a substantially nonoxidizing atmosphere, to volatilize organic components and sinter the inorganic binder and ceramic solids.

In the following examples all parts and percentages are by weight and degrees are in centigrade unless otherwise indicated.

A. Inorganics

Glass Frit: Ferro Glass #3467 milled in water, to a particle size range d50 of 2.3–2.7 microns, magnetically separated, and freeze dried; composition (component mole %); lead oxide (5.6), silicone dioxide (68.1), boron oxide (4.7), alumina (6.5), calcium oxide (11.1), sodium oxide (2.8) and potassium oxide (1.3).

Alumina: Aluminum Oxide ($Al_2O_3$); particle size d50=2.4–2.6 microns, surface area 3.5–4.5 $m^2g$.

Pigment: Cobalt aluminate ($CoAl_2O_4$).

B. Polymeric Binders

Binder I: Copolymer of 50% styrene and 50% the isobutyl half ester of maleic anhydride, Mw=2500, Tg=62° C., Acid No. 175.

Binder II: Copolymer of 75% methylmethacrylate, and 25% methacrylic acid, Mw=7000, Tg=120° C., Acid No. 164.

Binder III: Copolymer of 21% methacrylic acid, 38% ethylacrylate and 41% methylmethacrylate, Mw=50,000, Tg=101° C., Acid No. 120.

Binder IV: Copolymer formed of 34% methylmethacrylate, 16% acrylic acid, 40% octylacrylamide, 6% hydroxypropylmethacrylate, and 4% tert-butylaminoethylmethacrylate, Mw 50,000, Tg 120° C., Acid No. 118.

C. Monomers

Monomer I TEOTA 1000 - Polyoxyethylated trimethylolpropane triacrylate; Mw 1162

Monomer II Monohydroxy Polycaprolactone monoacrylate Mw458

D. Solvents beta-terpineol (1-methyl-1-(4-methyl-4-hydroxycyclohexyl)ethene),

E. Initiators

TBAQ: 2-tert. Butylanthraquinone

BP/MK: Benzophenone/Michler's ketone

F. Stabilizer

Antioxident: Ionol:2,6-di-tert.-butyl-4-methylphenol.

G. Dispersant

A-B Dispersant I—see description above

A-B Dispersant II—see description above.

PREPARATION OF DIELECTRIC PASTE

A. Preparation of Organic Vehicle

Organic components, solvent and acrylic polymer are mixed and heated with stirring to 135° C. and heating and stirring continued until all the acrylic polymer has dissolved. The solution is then cooled to 100° C. and the initiator and stabilizer added. This mixture is then stirred at 100° C. until the solids have dissolved, after which the solution is passed through a 400 mesh filter and allowed to cool.

B. Preparation of Dielectric Inorganics—Glass Frit

The glass frit, Ferro 3467 8Kg, is milled in 8 liters of water in a Sweco Mill using 0.5 in diameter by 0.5 in long alumina cylinders for approximately 16 hours to achieve a d50 particle size distribution of 2.3–2.7 microns. The frit water mixture is then passed through a 400 mesh screen and passed through a S. G. Franz Model 241F2 Magnetic Separator at a DC setting of 11.5V and 30 amps.

The glass frit mixture is then freeze dried using a Virtis Consol 12 Freeze Drier. This procedure usually requires three days to remove all the water.

Ceramic - Alumina

The alumina A14, as received from Alcoa Inc., 8Kg, is milled in 8 liters of water for from 14–16 hours in a Sweko Mill using 0.5 in diameter by 0.5 in long alumina cylinders. This milling time and configuration gives a d50 particle size range of 2.3–2.7 microns. The water alumina mixture is then passed through a 400 mesh screen and passed through a S. G. Franz Model 241F2 Magnetic Separator at a D.C. setting of 11.5V and 30 Amps. The water alumina mixture is freeze dried using a Virtis Consol 12 Freeze Drier. This procedure requires approximately three days to remove all the water. The resulting alumina powder is an agglomerate free free flowing powder.

Alumina - Cobalt Aluminate

The alumina 8Kg and cobalt aluminate pigment 144 gm are mixed in 8 liters of water and milled in the Sweco using 0.5 in diameter by 0.5 in long alumina cylinders for one hour. This is done to thoroughly mix these materials. The milled alumina-pigment mixture is passed through a 400 mesh screen and then through a S. G. Franz Midel 241F2 Magnetic Separator at a D.C. Setting of 11.5V and 30 Amps. The mixture is freeze dried in a virtis Consol 12 Freeze Drier. This requires approximately three days to remove all the water.

C. Paste Formulation

The dielectric paste is prepared, under yellow light, by mixing the organic vehicle, monomer, and dispersant into a mixing vessel. The glass frit and alumina/cobalt aluminate mixture is then added. The composition is then mixed for 30 minutes. The mixture is aged for approximately 12 hours and then roll milled using a three roll mill, at a roll pressure of 400 psi. Usually five passes through the mill are sufficient to thoroughly mix the composition. The paste is then screened through a 400 mesh screen.

The paste viscosity at this point is adjusted by the addition of beta-terpineol to 80–120 P.S. This viscosity range is optimum for screen printing.

D. Process Conditions

Care is taken to avoid dirt contamination in the process of preparing coating compositions and in preparing dielectric parts since such contamination can lead to defects in the fired dielectric. The process work is best done in a class-100 clean room.

The paste is applied to ceramic parts by screen printing using a 325 mesh patterned screen. The parts are dried at between 75°–100° C. in a nitrogen or air atmosphere oven. The dried coating has a thickness of 20 microns. A second printing and drying step is normally performed to give a thicker part (40 microns).

The parts are exposed, by contact with the phototarget, with either a Berkey-Askor vacuum printer or a columnated HTG UV exposure source, using a 15 second nitrogen purge and a 15 second drawdown in the vacuum printer. The optimum exposure time is determined from an exposure series that yields information on the best exposure to yield the correct size vias or photoformed holes in the dielectric after development.

The exposed parts are developed using a Du Pont ADS-24 Processor containing 1% sodium carbonate as the developer. Temperature can be varied from 20°–45° C. Solvent is sprayed at 30 psi for a development rate of 3.4–15 ft/minute through a 4 ft chamber.

The developed parts are dried in a forced draft oven at 75° C. for 15 min and fired in a furnace with peak temperature of 900° C. over a two-hour cycle. In firing the composition of the invention, is exposed to a substantially nonoxidizing atmosphere up to the glass transition temperature of the inorganic binder and to an essentially completely nonoxidizing atmosphere during the sintering phase of the final step.

By the term "substantially nonoxidizing atmosphere" is meant an atmosphere which contains insufficient oxygen to effect any significant oxidation of copper metal, but which nevertheless contains sufficient oxygen to effect oxidation of the organic materials. In practice, it has been found that a nitrogen atmosphere of 100–1000 ppm $O_2$ is appropriate in the presintering phase of the firing step. From 300 to 800 ppm $O_2$ is preferred. The amount of oxygen is increased as the thickness of the dielectric layer increases. For two layers of dielectric paste which fire out to 20 microns, 300 to 400 ppm $O_2$ is sufficient. On the other hand, the essentially completely nonoxidizing atmosphere used during the glass sintering step of the firing step refers to a nitrogen atmosphere containing only residual amounts of $O_2$, e.g., about 10 ppm. It is preferred to fire the composition of the invention at low heating rates in order to minimize physical defects in the fired layer.

In each of the following examples the following was employed:

| | % |
|---|---|
| Alumina/Cobalt Aluminate | |
| Alumina | 98.2 |
| Cobalt Aluminate | 1.8 |
| Glass Frit | |
| $SiO_2$ | 40.2 |
| $BaCO_3$ | 17.9 |
| $Al_2O_3$ | 9.9 |
| ZnO | 8 |
| MgO | 5 |
| $B_2O_3$ | 5.9 |
| CaO | 5.1 |
| PbO | 8 |

TEST PROCEDURES

A capacitor is formed from the above-described dielectric film comprising a copper disk having an area of 1 cm$^2$ and a contact tab supported on an alumina substrate. Overlying the copper disk is a layer of the dielectric film and overlying the dielectric layer is a second copper disk of the same size having a contact tab rotated 90°–180° with respect to the lower tab.

Capacitance and dissipation factors are measured at 1 kHz using a Hewlett-Packard HP4274A multi-frequency LCR meter, while insulation resistance is measured using a Super megohm meter Model RM 170 (Biddle Instruments, AVO, Ltd., U.K.). Insulation resistance measurements are made after charging the capacitor to 100 VDC. Each number is the average of at least 10 measurements. The thickness of the dielectric layer is measured using a Gould Surfanalyzer 150/recorder 250. The dielectric constant is calculated using the equation:

$$K = \frac{C}{A} \cdot t,$$

wherein

C is the capacitance of the capacitor;

A is the area of small electrode in contact with the dielectric layer; and t is the thickness of the dielectric layer.

All capacitors were aged for at least 15 hours after firing before making the electrical measurements. It is common that the dissipation factor (DF) decreases by 0.5–2% within this aging time period. However, capacitance is generally unaffected during this period.

Dissipation factor on a wet basis is determined by placing a drop of water on the upper copper disk so that it wets the disk but not the contact tab. After standing for 30 seconds, DF is determined in the usual manner. The dielectric is considered to be hermetic when the wet DF is less than 1%. Below 0.5% is preferred.

EXAMPLE 1

| Component | Parts | |
|---|---|---|
| Alumina/Cobalt Aluminate | | 27.6 |
| Glass Frit | | 27.4 |
| Vehicle | | 31.0 |
| Binders: | | 40.0 |
| Binder II | 36.0 | |
| Binder III | 4.0 | |
| Solvent: beta terpineol | | 54.3 |
| Initiator: TBAQ | | 5.4 |
| Antioxident: Ionol | | 0.3 |
| Monomer: TEOTA | | 10.6 |
| Dispersant: A-B Dispersant I | | 2.1 |
| Results | | |
| Resolution: 3 mil vias | | |
| Photo Speed: 50–90 mj/cm² | | |
| Development: 1% Aqueous Sodium Carbonate | | |

EXAMPLE 2

| Component | Parts | |
|---|---|---|
| Alumina/Cobalt Aluminate | | 27.6 |
| Glass Frit | | 27.4 |
| Vehicle | | 31.0 |
| Binders: | | |
| Binder II | | 40.0 |
| Solvent: beta terpineol | | 54.9 |
| Initiators: | | 4.80 |
| Benzophenone | 4.0 | |
| Michler's ketone | 0.80 | |
| Antioxident: Ionol | | 0.30 |
| Monomer: TEOTA | | 10.6 |
| Results | | |
| Resolution: 2 mil vias | | |
| Photo Speed: 50–90 mj/cm² | | |
| Development: 1% Aqueous Sodium Carbonate | | |

EXAMPLE 3

| Component | Parts | |
|---|---|---|
| Alumina/Cobalt Aluminate | | 27.6 |
| Glass Frit | | 27.4 |
| Vehicle | | 31.0 |
| Binders: | | |
| Binder II | | 40.0 |
| Solvent: beta terpineol | | 54.9 |
| Initiators: | | 5.05 |
| Benzophenone | 4.25 | |
| Michler's ketone | 0.80 | |
| Antioxident: Ionol | | 0.3 |
| Monomer: Monomer II | | 10.6 |
| Dispersant: A-B Dispersant I | | 2.1 |
| Results | | |

| Component | Parts |
|---|---|
| Resolution: 2 mil vias | |
| Photo Speed: 50–90 mj/cm² | |
| Development: 1% Aqueous Sodium Carbonate | |

EXAMPLE 4

| Component | Parts | |
|---|---|---|
| Alumina/Cobalt Aluminate | | 27.6 |
| Glass Frit | | 27.4 |
| Vehicle | | 31.0 |
| Binders: | | |
| Binder II | | 40.0 |
| Solvent: beta terpineol | | 54.15 |
| Initiators: | | 5.55 |
| Benzophenone | 4.75 | |
| Michler's ketone | 0.80 | |
| Antioxident: Ionol | | 0.3 |
| Monomer: | | |
| Monomer II | | 7.95 |
| TEOTA | | 2.65 |
| Dispersant: A-B Dispersant I | | 2.1 |
| Results | | |
| Resolution: 2 mil vias | | |
| Photo Speed: 50–90 mj/cm² | | |
| Development: 1% Aqueous Sodium Carbonate | | |

EXAMPLE 5

| Component | Parts | |
|---|---|---|
| Alumina/Cobalt Aluminate | | 27.6 |
| Glass Frit | | 27.4 |
| Vehicle | | 31.0 |
| Binders: | | |
| Binder II | | 40.0 |
| Solvent: beta terpineol | | 54.15 |
| Initiators: | | 5.55 |
| Benzophenone | 4.75 | |
| Michler's ketone | 0.80 | |
| Antioxident: Ionol | | 0.3 |
| Monomer: | | |
| Monomer II | | 9.54 |
| TEOTA | | 1.06 |
| Dispersant: A-B Dispersant I | | 2.1 |
| Results | | |
| Resolution: 2 mil vias | | |
| Photo Speed: 50–90 mj/cm² | | |
| Development: 1% Aqueous Sodium Carbonate | | |

EXAMPLE 6

| Component | Parts | |
|---|---|---|
| Alumina/Cobalt Aluminate | | 27.6 |
| Glass Frit | | 27.4 |
| Vehicle | | 31.0 |
| Binders: | | 40.0 |
| Binder II | 36.0 | |
| Binder III | 4.0 | |
| Solvent: beta terpineol | | 54.15 |
| Initiators: | | 5.55 |
| Benzophenone | 4.75 | |
| Michler's ketone | 0.80 | |
| Antioxident: Ionol | | 0.3 |
| Monomer: TEOTA | | 10.6 |
| Dispersant: A-B Dispersant I | | 2.1 |
| Results | | |
| Resolution: 2 mil vias | | |
| Photo Speed: 50–90 mj/cm² | | |

-continued

| Component | Parts |
|---|---|
| Development: 1% Aqueous Sodium Carbonate | |

EXAMPLE 7

| Component | | Parts |
|---|---|---|
| Alumina/Cobalt Aluminate | | 27.6 |
| Glass Frit | | 27.4 |
| Vehicle | | 31.0 |
| Binders: | | 40.0 |
| Binder II | 40.0 | |
| Solvent: beta terpineol | | 54.65 |
| Initiators: | | 5.05 |
| Benzophenone | 4.25 | |
| Michler's ketone | 0.80 | |
| Antioxident: Ionol | | 0.30 |
| Monomer: TEOTA | | 10.6 |
| Dispersant: A-B Dispersant II | | 2.1 |
| Results | | |
| Resolution: 5 mil vias | | |
| Photo Speed: 50-90 mj/cm$^2$ | | |
| Development: 1% Aqueous Sodium Carbonate | | |

EXAMPLE 8

| Component | | Parts |
|---|---|---|
| Alumina/Cobalt Aluminate | | 27.6 |
| Glass Frit | | 27.4 |
| Vehicle | | 31.0 |
| Binders: | | 40.0 |
| Binder II | 40.0 | |
| Solvent: beta terpineol | | 50.9 |
| Initiator: TBAQ | | 5.8 |
| Antioxident: Ionol | | 0.3 |
| Monomer: TEOTA | | 8.6 |
| Dispersant: A-B Dispersant II | | 2.1 |
| Results | | |
| Resolution: 4 mil vias | | |
| Photo Speed: 50-90 mj/cm$^2$ | | |
| Development: 1% Aqueous Sodium Carbonate | | |

EXAMPLE 9

| Component | | Parts |
|---|---|---|
| Alumina/Cobalt Aluminate | | 27.6 |
| Glass Frit | | 27.4 |
| Vehicle | | 31.0 |
| Binders: | | 40.0 |
| Binder I | 38.5 | |
| Binder II | 1.5 | |
| Solvent: beta terpineol | | 54.3 |
| Initiator: TBAQ | | 5.4 |
| Antioxident: Ionol | | 0.3 |
| Monomer: TEOTA | | 8.6 |
| Dispersant: A-B Dispersant I | | 2.1 |
| Results | | |
| Resolution: 3 mil vias | | |
| Photo Speed: 50-90 mj/cm$^2$ | | |
| Development: 1% Aqueous Sodium Carbonate | | |

What is claimed is:

1. In a photosensitive ceramic coating composition which is fireable in a substantially nonoxidizing atmosphere comprising an admixture of:
    (a) finely divided particles of ceramic solids having a surface area-to-weight ratio of no more than 10 m$^2$/g and at least 80 wt. % of the particles having a size of 1-10 μm, and
    (b) finely divided particles of an inorganic binder having a glass transition temperature in the range from of 550° to 825° C., a surface area-to-weight ratio of no more than 10 m$^2$/g and at least 90 wt. % of the particles having a size of 1-10 μm, the weight ratio of (b) to (a) being in a range from 0.6 to 2, dispersed in an organic medium comprising
    (c) an organic polymeric binder, and
    (d) a photoinitiation system, dissolved in
    (e) photohardenable monomer, and
    (f) an organic medium
wherein the improvement comprises an organic polymeric binder containing a copolymer or interpolymer of a C$_1$-C$_{10}$ alkyl acrylate, C$_1$-C$_{10}$ alkyl methacrylate, styrene, substituted styrene or combinations thereof and an ethylenically unsaturated carboxylic acid, wherein a moiety in the binder derived from the unsaturated carboxylic acid comprises at least 15 weight percent of the polymer and wherein the binder has a molecular weight not greater than 50,000 and wherein the composition upon imagewise exposure to actinic radiation is developable in an aqueous solution containing 1 percent by weight sodium carbonate.

2. The composition of claim 1 wherein the organic polymeric binder is a copolymer of methylmethacrylate.

3. The composition of claim 1 wherein the organic polymeric binder contains moieties derived from the unsaturated carboxylic acid is not greater than 30 percent by weight of the binder.

4. The composition of claim 3 wherein the molecular weight of the organic polymeric binder is not greater than 25,000.

5. The composition of claim 4 wherein said molecular weight is not greater than 15,000.

6. The composition of claim 1 wherein the organic medium is beta-terpineol.

7. The combination of claim 1 wherein the organic medium contains a dispersant.

* * * * *